(12) United States Patent
Teshima et al.

(10) Patent No.: US 9,105,788 B2
(45) Date of Patent: Aug. 11, 2015

(54) SILICON PHOTOELECTRIC MULTIPLIER

(71) Applicant: Max-Planck-Gesellschaft zur Foerderung der Wissenschaften e. V., Munich (DE)

(72) Inventors: Masahiro Teshima, Unterschleissheim (DE); Razmick Mirzoyan, Unterschleissheim (DE); Boris Anatolievich Dolgoshein, Moscow (RU)

(73) Assignee: MAX-PLANCK-GESELLSCHAFT ZUR FOERDERUNG DER WISSENSCHAFTEN E.V., Munich (DE)

( * ) Notice: Subject to any disclaimer, the term of this patent is extended or adjusted under 35 U.S.C. 154(b) by 0 days.

(21) Appl. No.: 13/658,267

(22) Filed: Oct. 23, 2012

(65) Prior Publication Data

US 2013/0181315 A1    Jul. 18, 2013

Related U.S. Application Data

(63) Continuation of application No. PCT/IB2010/001530, filed on Apr. 23, 2010.

(51) Int. Cl.
*H01L 27/14* (2006.01)
*H01L 31/102* (2006.01)
*G01T 1/20* (2006.01)
*G01T 1/24* (2006.01)
(Continued)

(52) U.S. Cl.
CPC ............ *H01L 31/102* (2013.01); *G01T 1/2018* (2013.01); *G01T 1/24* (2013.01); *H01L 27/146* (2013.01); *H01L 27/1446* (2013.01); *H01L 27/14601* (2013.01); *H01L 31/107* (2013.01); *H01L 31/115* (2013.01); *H01L 31/1804* (2013.01); *H01L 31/1864* (2013.01); *Y02E 10/547* (2013.01)

(58) Field of Classification Search
USPC .......................... 257/428, 443, 660; 438/506
See application file for complete search history.

(56) References Cited

U.S. PATENT DOCUMENTS

| | | | | |
|---|---|---|---|---|
| 5,449,945 | A * | 9/1995 | Brueck et al. ................. | 257/451 |
| 7,297,955 | B2 * | 11/2007 | Amemiya et al. ........ | 250/363.05 |
| 8,445,848 | B2 * | 5/2013 | Tsuji ........................... | 250/338.3 |
| 2004/0173866 | A1 * | 9/2004 | Egawa et al. ................. | 257/462 |
| 2005/0258449 | A1 | 11/2005 | Lutz et al. | |

FOREIGN PATENT DOCUMENTS

| | | |
|---|---|---|
| JP | 53120395 A | 10/1978 |
| JP | 58030164 A | 2/1983 |

(Continued)

OTHER PUBLICATIONS

Ivan Rech et al, Optical crosstalk in single photon avalanche diode arrays: a new complete model, Jun. 6, 2008, Optics Express, vol. 16, No. 12, pp. 1-14.*

(Continued)

*Primary Examiner* — Nicholas Tobergte
(74) *Attorney, Agent, or Firm* — Cooper Legal Group, LLC

(57) ABSTRACT

A cell for a silicon-based photoelectric multiplier may comprise a first layer of a first conductivity type and a second layer of a second conductivity type formed on the first layer. The first layer and the second layer may form a first p-n junction. The cell may be processed by an ion implantation act wherein parameters of the ion implantation are selected such that due to an implantation-induced damage of the crystal lattice, an absorption length of infrared light of a wavelength in a range of ~800 nm to 1000 nm is decreased.

19 Claims, 5 Drawing Sheets

(51) Int. Cl.
*H01L 27/144* (2006.01)
*H01L 27/146* (2006.01)
*H01L 31/107* (2006.01)
*H01L 31/115* (2006.01)
*H01L 31/18* (2006.01)

(56) References Cited

FOREIGN PATENT DOCUMENTS

| | | |
|---|---|---|
| JP | 60211886 A | 10/1985 |
| RU | 2086047 C1 | 7/1997 |
| RU | 2127473 C1 | 3/1999 |
| WO | 2008048694 A2 | 4/2008 |

OTHER PUBLICATIONS

International Search Report cited in related application No. PCT/IB2010/001530 dated May 23, 2011, pp. 1-4.

Lutz, et al., "The Avalanche Drift Diode: A New Detector Concept for Single Photon Detection", 2004 IEEE Nuclear Science Symposium Conference Record Oct. 16-22, 2004, Rome, Italy, 2004 IEEE Nuclear Science Symposium Conference Record (IEEE Cat. No. 04CH37604) IEEE Piscataway, NJ USA, vol. 1, Oct. 16, 2004 (Oct. 16, 2006), pp. 21-24, XP010818787, DOI: DOI:10.1109/NSSMIC. 2004.1462061 ISBN: 978-0-7803-8700-3 pp. 21-22; figure 1.

Sadygov, et al., "Three Advanced Designs of Micro-Pixel Avalanche Photodiodes: Their Present Status, Maximum Possibilities and Limitations", Nuclear Instruments & Methods in Physics Research, Section-A: Accelerators, Spectrometers, Detectors and Associated Equipment, Elsevier, Amsterdam, NL, vol. 567, No. 1. Nov. 1, 2006, pp. 70-73, XP025056291, ISSN: 0168-9002, DOI: DOI:10.1016/J. NIMA.2006.05.215 [retrieved on Nov. 1, 2006] pp. 70-72; figures 1-2.

Sciacca et al., "Silicon Planar Technology for Single-Photon Optical Detectors", IEEE Transactions on Electron Devices, IEEE Service Center, Pisacataway, NJ, US, vol. 50, No. 4, Apr. 1, 2003, pp. 918-925, XP002575716, ISSN: 0018-9383, DOI: DOI:I0.II09/TED. 2003.812095 [retrieved on Apr. 1, 2003] pp. 918-919; figure 1.

\* cited by examiner

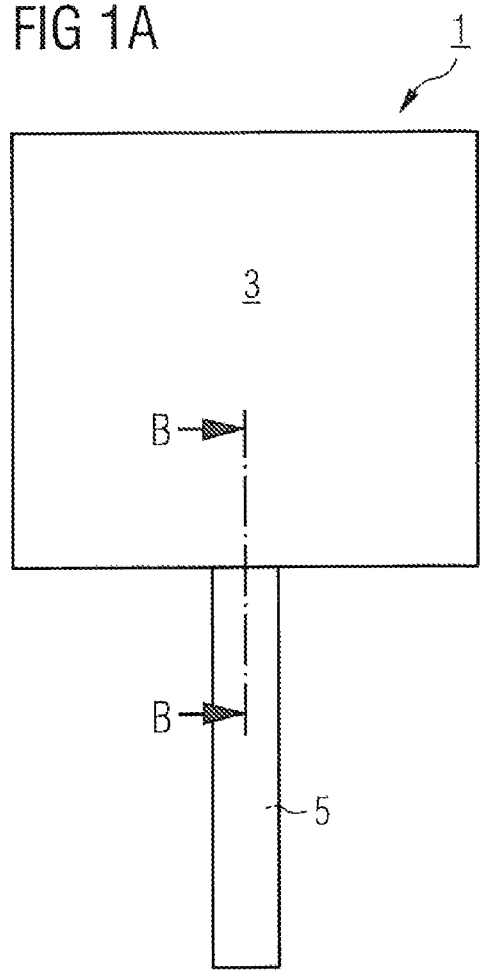
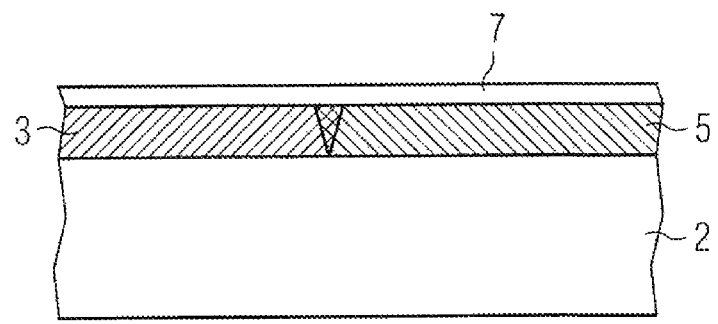

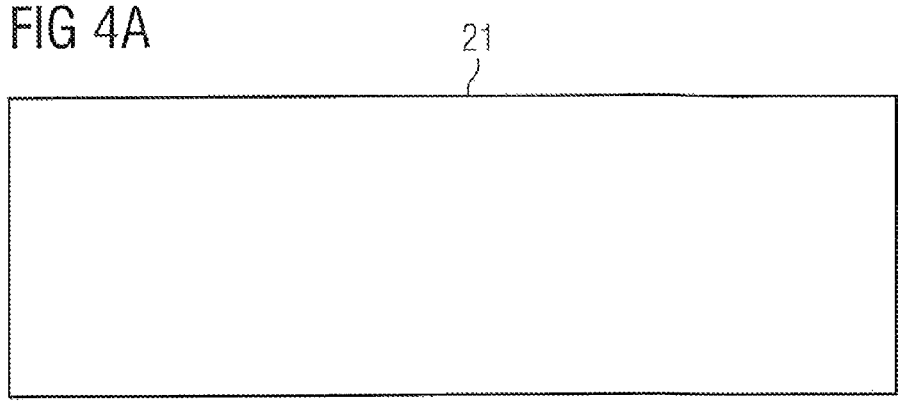
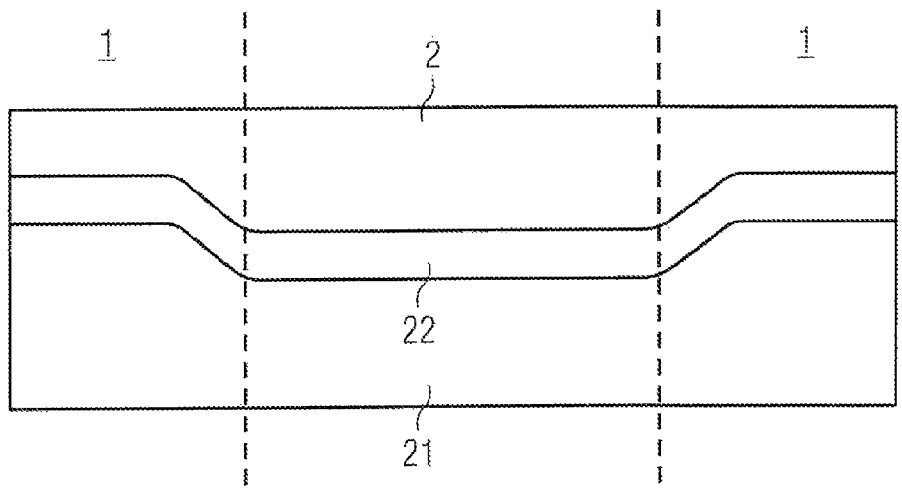
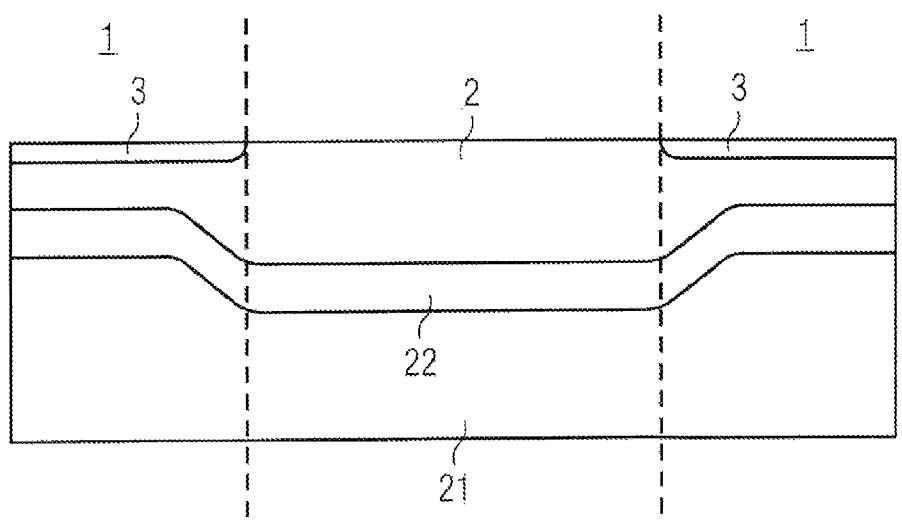

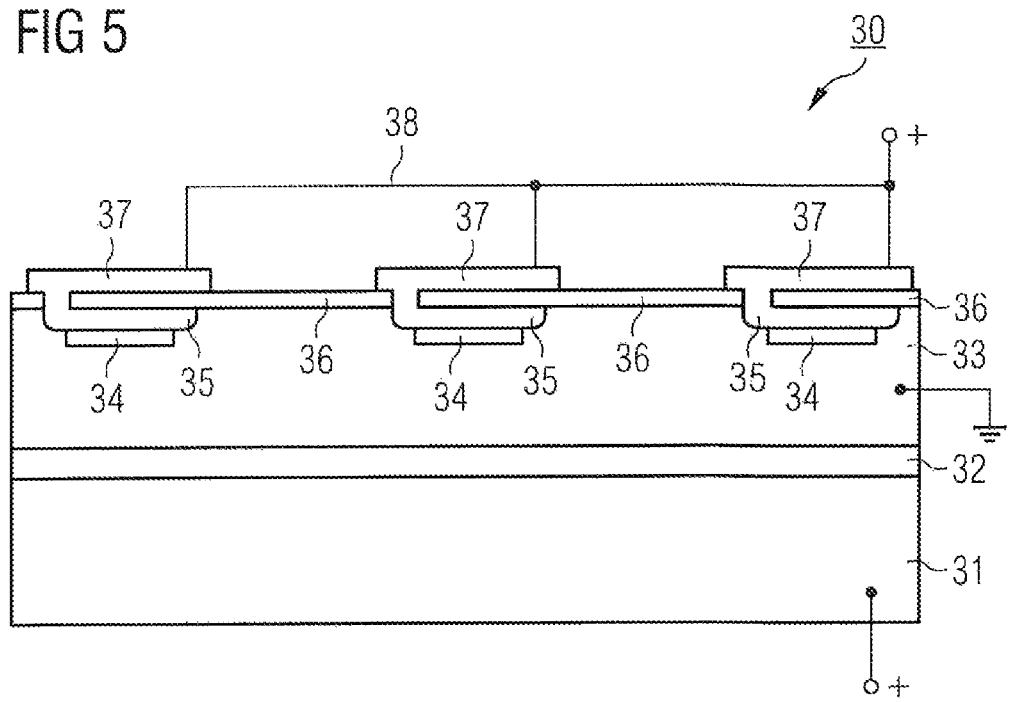
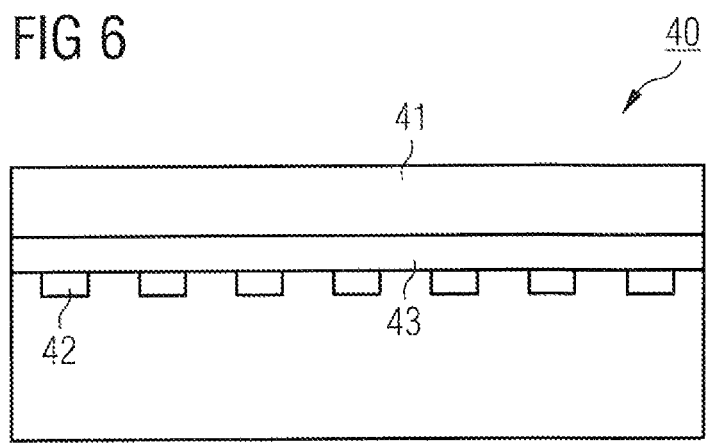

SILICON PHOTOELECTRIC MULTIPLIER

RELATED APPLICATION

This application corresponds to International Patent Application PCT/IB2010/001530, filed on Apr. 23, 2010, at least some of which may be incorporated herein.

DESCRIPTION

Highly efficient silicon photoelectric multiplier with optical crosstalk suppression due to damage of Si crystal induced by high energy ion implantation.

SUMMARY

The disclosed subject matter relates to the field of semiconductor optoelectronic devices, particularly to photodetectors with high efficiency of light detection, including the visible part of the spectrum. The photodetectors according to the disclosed subject matter can be used in a wide field of applications which employ the detection of very weak and fast optical signals, such as, for example, industrial and medical tomography, life science, nuclear, particle and astroparticle physics, etc.

The document EP 1 755 171 B1 describes a silicon photomultiplier (SiPM) composed of an array of individual cells. In particular, the SiPM comprises a silicon substrate and a plurality of cells which are located on a surface of said substrate in an epitaxial layer. Each cell comprises an internal individual quenching resistor made of high resistant silicon and located on top of a silicon oxide layer which covers all cells. In operation, each cell is supplied with reverse bias that exceeds break-down voltage. When a photon is absorbed in the cell, a Geiger discharge takes place, the discharge being limited by the external quenching resistor. One general problem of these devices can be described as "optical cross-talk". It originates from photons created in the Geiger discharge with a rate of about 10-5 photons per electron. The effective wavelength of photons which are responsible for optical crosstalk is about 1 µm, thereby enabling the photons to travel considerably large distances in the silicon before being absorbed. The photons can thus propagate to another not primarily fired pixel and initiate a discharge there. In the document EP 1 755 171 B1 it is suggested to solve this problem by introducing triangular grooves between the cells which serve as optical barriers between the cells so that secondary photons generated in one cell cannot reach neighboring cells. These grooves have to have a size large enough to achieve a good suppression of the optical cross-talk which in turn leads to a loss of photon detection efficiency. Another problem of the device described in document EP 1 755 171 B1 is that it shows a low detection efficiency for wavelengths above ~800 nm.

It is therefore an object of the disclosed subject matter to provide a cell for a silicon-based photoelectric multiplier and a silicon-based photoelectric multiplier composed of a plurality of cells in which optical cross-talk between the cells is significantly reduced without significantly reducing the optical detection efficiency. It is another object of the disclosed subject matter to provide a cell and a silicon-based photoelectric multiplier with increased optical detection efficiency for wavelengths above ~800 nm.

One aspect of the disclosed subject matter is to increase the optical absorption of the silicon detector in the same wavelength range as that of the secondary optical photons responsible for optical crosstalk. In order to increase the optical absorption around 1000 nm, it is suggested to introduce a particular amount of crystallographic defects into the silicon material. These can be, for example, dangling bonds, vacancies, interstitials or other types of defects known to function as efficient trap centers for electrons. Electrons trapped by those defects will occupy energy states within the band gap of silicon. Therefore, optical absorption at a wavelength of 1000 nm will be increased since electrons can be exited from the valence band into one of the energetic defect states (sub gap absorption) and then into the conduction band. The defects can be generated by an ion implantation of high ion energy and high ion dose into the silicon device.

The increase of the optical absorption at a wavelength around and/or below 1000 nm effects a significant reduction of optical cross-talk between the cells since secondary photons generated by a Geiger discharge of one cell can no further reach a neighboring cell as they are absorbed in-between the cells with a high probability. As a result, the optical cross-talk can be significantly reduced without forming any mechanical trenches or grooves into the silicon surface for separating the cells from each other. A further advantage of the increased absorption at 1000 nm lies in the fact that, due to the defect states in the band gap of silicon, the optical absorption increases in general for wavelengths above ~800 nm. Therefore, the optical detection efficiency of the device is improved for long wavelengths region spectra.

According to a first aspect, the disclosed subject matter is directed to a cell for a silicon-based photoelectric multiplier which comprises a first layer of a first conductivity type, a second layer of a second conductivity type located on the first layer, wherein the first layer and the second layer form a first p-n junction, and wherein the cell is further processed by an ion implantation act wherein the parameters of the ion implantation are selected such that due to an implantation-induced damage of the crystal lattice, an absorption length of infrared light of wavelengths in the range of ~800 to 1000 nm is decreased by a certain factor, in particular decreased by a factor of several times, for example by a factor of 3, more preferably by at least a factor of 5, wherein this factor can be different for different wavelengths.

According to an embodiment of the first aspect of the disclosed subject matter, the parameters of the ion implantation are selected such that the absorption length is decreased by a factor of 10 or more.

According to an embodiment of the first aspect of the disclosed subject matter, the ion implantation act comprises an ion dose in the range of $10^{13}$ to $10^{15}$ $cm^{-2}$ and ion energy in the range of 1 MeV to 10 MeV, in particular in the range of 3 MeV to 5 MeV.

According to an embodiment of the first aspect of the disclosed subject matter, the ion implantation act is followed by an annealing act. According to a further embodiment thereof, the annealing act is carried out at a temperature in a range between 300° C. and 1000° C. for a time duration of 10 s or longer.

According to an embodiment of the first aspect of the disclosed subject matter, the cell further comprises a substrate of the second conductivity type and a doped buried layer of the first conductivity tape, wherein the substrate and the doped buried layer form a second p-n junction.

According to an embodiment of the first aspect of the disclosed subject matter, the cell further comprises a resistor layer electrically connected to the second layer. According to a further embodiment thereof, the resistor layer comprises a resistance value in order to function as a quenching resistor for quenching the Geiger discharge. According to an embodiment the resistor layer is made of low doped silicon or of polycrystalline silicon.

According to a second aspect the disclosed subject matter is directed to a cell for a silicon-based photoelectric multiplier comprising a first layer of a first conductivity type and a second layer of a second conductivity type formed on the first layer, wherein the first layer and the second layer form a first p-n junction, wherein the cell is further processed by an ion implantation act comprising an ion dose in the range of $10^{13}$ to $10^{15}$ cm$^{-2}$ and an ion energy in the range of 1 MeV to 10 MeV, in particular in the range of 3 MeV to 5 MeV.

According to an embodiment of the second aspect of the disclosed subject matter, the ion implantation act is followed by an annealing act. According to a further embodiment thereof the annealing act is carried out at a temperature in a range of 300° C. to 1000° C. and a time duration of 10 s or longer.

Further embodiments can be formed in connection with the disclosed subject matter.

The disclosed subject matter also relates to a silicon-based photoelectric multiplier comprising a plurality of cells such as those of the first or second aspect of the disclosed subject matter, wherein the cells are all fabricated on one common substrate.

The disclosed subject matter also relates to a radiation detector comprising a scintillator and an array of silicon-based photoelectric multipliers such as those as described in the preceding paragraph, wherein the silicon-based photoelectric multipliers are arranged to receive bursts of light produced by the scintillator in response to received radiation.

According to a third aspect the disclosed subject matter is directed to a method for fabricating a cell for a silicon-based photoelectric multiplier, a method comprising providing a first layer of a first conductivity type and a second layer of a second conductivity type formed on the first layer, wherein the first layer and the second layer form a first p-n junction, and performing an ion implantation into the first and second layers and selecting the parameters of the ion implantation such that due to an implantation-induced damage of the crystal lattice an absorption length of infrared light of a wavelength in the range of ~800 nm to 1000 nm is decreased, in particular decreased by at least a factor of 3, more particular decreased by at least a factor of 5.

According to an embodiment of the third aspect of the disclosed subject matter, the method acts can be carried out in any desired order and not necessarily in the order as indicated above. It is also possible to perform the ion implantation before fabricating the first and second layers and the first p-n junction.

According to an embodiment of the third aspect of the disclosed subject matter, the method further comprises selecting the parameters of the ion implantation such that the ion dose is in the range of $10^{13}$ to $10^{15}$ cm$^{-2}$ and the ion energy is in the range of 1 MeV to 10 MeV, in particular in the range of 3 MeV to 5 MeV.

According to an embodiment of the third aspect of the disclosed subject matter, the method further comprises annealing the cell after the ion implantation. According to a further embodiment thereof, the annealing is carried out at a temperature in a range of 300° C. to 1000° C. and a time duration of 10 s or longer.

According to an embodiment of the third aspect of the disclosed subject matter, the method further comprises using ions for the implantation that are known to act as donor or acceptor ions in silicon. According to an embodiment thereof, the method further comprises using ions of the sort of one of phosphorus, arsenic, and/or boron.

According to an embodiment of the third aspect of the disclosed subject matter, the method further comprises providing a substrate of the second conductivity type and generating a doped buried layer of the first conductivity type, so that the substrate and the doped buried layer form a second p-n junction. According to an embodiment thereof, the doped buried layer is generated by the ion implantation.

According to an embodiment of the third aspect of the disclosed subject matter, a resistor layer is provided in the form of a semiconductor layer comprising a dopant concentration in order to yield a desired resistance or resistivity value in order to function as a quenching resistor for quenching the avalanche current. The disclosed subject matter therefore allows for the integration of the fabrication of the quenching resistor layer within a complete CMOS fabrication process.

According to an alternative embodiment of the third aspect of the disclosed subject matter, the resistor layer is provided in the form of a polysilicon layer or a thin metallic layer.

DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

FIG. 1A illustrates a top view representation of a cell of a silicon-based photoelectric multiplier according to a first embodiment.

FIG. 1B illustrates a cross-sectional representation of a cell of a silicon-based photoelectric multiplier according to a first embodiment.

FIG. 4A illustrates a cross-sectional representation of intermediate products along line A-A of FIG. 2 of the silicon-based photoelectric multiplier for illustrating a method for fabricating cells for a silicon-based photoelectric multiplier according to an embodiment.

FIG. 4B illustrates a cross-sectional representation of intermediate products along line A-A of FIG. 2 of the silicon-based photoelectric multiplier for illustrating a method for fabricating cells for a silicon-based photoelectric multiplier according to an embodiment.

FIG. 4C illustrates a cross-sectional representation of intermediate products along line A-A of FIG. 2 of the silicon-based photoelectric multiplier for illustrating a method for fabricating cells for a silicon-based photoelectric multiplier according to an embodiment.

FIG. 5 illustrates a side view representation of a cell of a silicon-based photoelectric multiplier according to a second embodiment.

FIG. 6 illustrates a cross-sectional representation of a radiation detector according to an embodiment.

DETAILED DESCRIPTION

Figure 2:
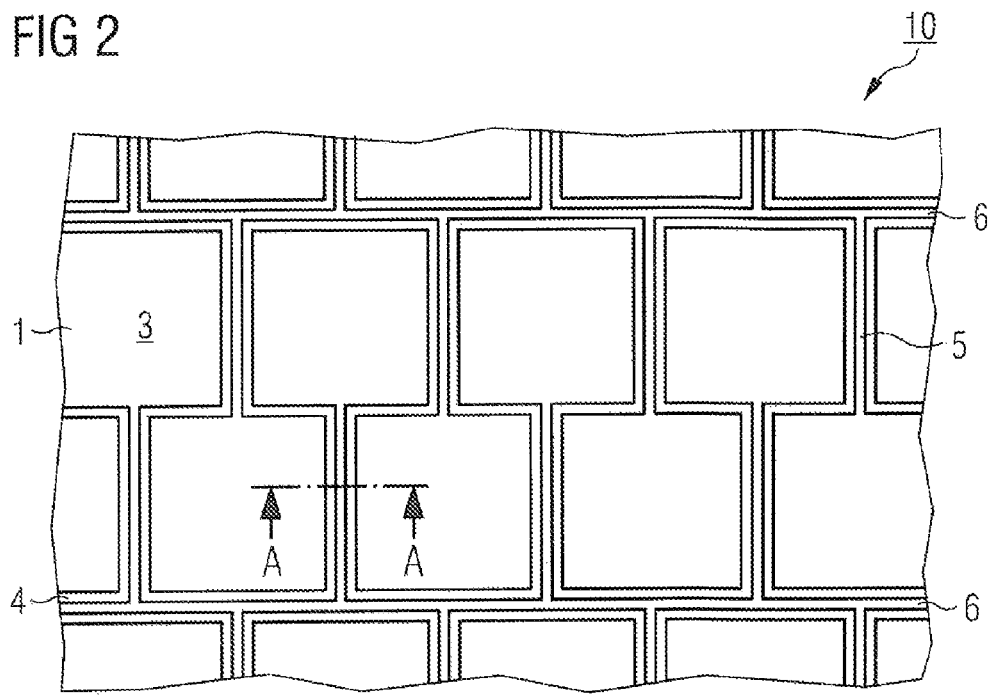
FIG. 2 illustrates a top view representation of a section of a silicon-based photoelectric multiplier according to a first embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the Figures are not necessarily to scale.

In the following detailed description, reference is made to the accompanying drawings, which form a part thereof, and in which is shown by way of illustration specific embodiments in which the disclosed subject matter may be practiced. In this regard, directional terminology, such as "upper", "lower", "left-hand", "right-hand", "front side", "backside", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the disclosed subject matter.

FIG. 1A shows a top view representation of a cell of a silicon-based photoelectric multiplier according to a first embodiment and FIG. 1B shows a cross-sectional representation of the cell along line B-B of FIG. 1A.

The cell 1 comprises a first layer 2 of a first conductivity type and a second layer 3 of a second conductivity type formed on the first layer 2 so that the first layer 2 and the second layer 3 form a first p-n junction. The cell 1 further comprises a quenching resistor layer 5 formed on the first layer 2 laterally besides the second layer 3 and connected to a lateral side face of the second layer 3.

The cell 1 and in particular the second layer 3 can have a rectangular or quadratic shape and the quenching resistor layer 5 can be connected to one of the side edges of the second layer 3, in particular in the center of the side edge. The quenching resistor layer 5 extends in a direction away from the second layer 3 to make electrical contact to a voltage distribution line (not shown) remote from the second layer 3. The cell 1 can also comprise an insulation layer 7 covering the first layer 2, the second layer 3 and the quenching resistor layer 5. The insulation layer 7 can be such that it covers the whole matrix of cells with merely one opening at an edge portion of the device for the purpose of electrically contacting the voltage distribution line. The second layer 3 and the quenching resistor layer 5 can be formed as well (e.g., within and/or near areas of the first layer 2) by using conventional ion implantation processes as known in CMOS fabrication technology. As can be seen in FIG. 1B, the implantation region of the second layer 3 is shown left-hatched and the implantation region of the quenching resistor layer 5 is shown right-hatched and an overlap between both regions can be provided when conducting the implantation acts so as to provide for a satisfactory electrical contact between both regions.

It is to be noted that the elements as shown in FIG. 1A are not necessarily to scale as regards their dimensions with respect to each other as well as the geometric dimensions of the elements themselves. For example the quenching resistor layer 5 is shown to have a strip-like shape wherein the strip-like quenching resistor layer 5 can have, for example, a length to width ratio of greater than 10, more preferably greater than 20, more preferably greater than 30. Moreover the ratio of the length of a side edge of the cell 1 or of the second layer 3 to the width of the strip-like quenching resistor layer 5 can be, for example, greater than 10, more preferably greater than 20, and/or more preferably greater than 30.

Furthermore the quenching resistor layer 5 can have a resistivity in the range of 10 to 50 KOhm/square. With such a resistivity the quenching resistor layer 5 can efficiently act as a quenching resistor for quenching the avalanche current in operation of the photodiode. The value of the resistivity can be adjusted by the geometric dimensions and the dopant concentration of the quenching resistor layer 5.

The second layer 3 can have a relatively high level dopant concentration which can, for example, be in the range of $10^{18}$ to $10^{19}$ cm$^{-3}$.

FIG. 2 shows a top view representation of a section of a silicon-based photoelectric multiplier according to an embodiment.

The photoelectric multiplier 10 depicted in FIG. 2 is comprised of a plurality of cells 1 such as that shown in FIG. 1A and FIG. 1B. They are arranged along rows wherein the cells 1 of one row are laterally displaced with respect to the cells 1 of an adjacent row wherein the displacement can be, for example, half the length of one side edge of a quadratically shaped cell 1.

The photoelectric multiplier 10 can have a plurality of voltage distribution lines 6. In the section of the photoelectric multiplier 10 as shown in FIG. 2 there are shown two voltage distribution lines 6 which are arranged along outer side edges of two adjacent rows of cells 1. The quenching resistor layers 5 of each cell 1 of one row extend in the narrow space between two neighboring cells 1 of an adjacent row and are electrically connected with the voltage distribution line 6 extending along the adjacent row. The voltage distribution lines 6 can also be made of a well area formed within the first layer 2. In particular the voltage distribution lines 6 can be formed of well areas having a dopant concentration of about $10^{19}$ cm$^{-3}$ or $5\times10^{18}$ cm$^{-3}$ to $5\times10^{19}$ cm$^{-3}$ so that they function as conductive wires. Thus the fabrication of the voltage distribution lines 6 can also be part of and embedded within the CMOS fabrication process.

Figure 3:
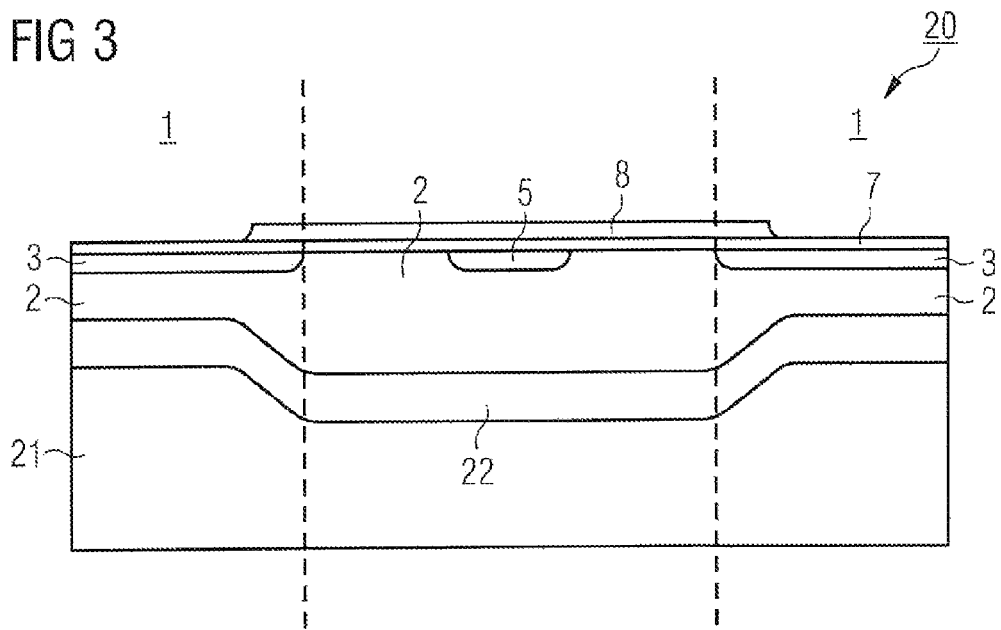
FIG. 3 illustrates a cross-sectional representation along line A-A of FIG. 2 of the silicon-based photoelectric multiplier according to a first embodiment.

FIG. 3 shows a cross-sectional representation along line A-A of FIG. 2 of the silicon-based photoelectric multiplier according to an embodiment.

The section of the photoelectric multiplier 20 shown in FIG. 3 includes the right part of one cell 1 shown on the left side of the drawing and the left part of a further cell 1 shown on the right side of the drawing and a region in between the adjacent cells 1, the region comprising a quenching resistor layer 5. The photoelectric multiplier 20 comprises a substrate 21 of a second conductivity type having a doping agent concentration in the range of $5\times10^{14}$-$5\times10^{16}$ cm$^{-3}$ and a buried first layer 22 of a first conductivity type having, for example, a peak doping agent concentration in the range of $5 \times 10^{17}$-$5 \times 10^{18}$ cm$^{-3}$. The buried layer 22 is generated by an ion implantation wherein the parameters of the ion implantation are selected such that an ion dose lies in the range of $10^{13}$ to $10^{15}$ cm$^{-2}$ and ion energy lies in the range of 1 MeV to 10 MeV, in particular in the range of 3 MeV to 5 MeV. With such an ion implantation a relatively high density of defects is generated in layers 2, 3 and 22, in particular in layers 2 and 3, especially in the vicinity of the first p-n junction between layers 2 and 3. This relatively high density of defects results in an increase of the absorption coefficient and a decrease of the absorption length for infrared light of wavelengths within the range of ~800 nm to 1000 nm by at least several times, for example at least a factor of 3, more preferably at least a factor of 5. As a first advantageous result thereof substantially less secondary Geiger photons emitted from the p-n junction at the time of a discharge can leave one cell and reach the neighboring cell and as a second advantageous result the longwave spectral portion of incident light will be sub gap absorbed so that the detection efficiency of light in this spectral portion can be increased. As a result of the ion implantation one may also obtain a gradient of doping concentration in the order of $10^{15}$-$10^{18}$ from up to down due to back scattering of implanted ions within the first layer 2; such a gradient creates a built-in electric field, said field forces carriers generated by yellow-red or infrared photons in the doping gradient region to move into Geiger depletion region to be detected. This contributes to the increase of long wavelength photon detection efficiency. The substrate 21 and the buried layer 22 form a second N-P junction at an interface between them.

Due to the efficient absorption of secondary Geiger photons it will not be necessary to introduce any mechanical grooves or trenches as optical barriers between the cells such as those shown and described in the above-identified European Patent EP 1 755 171 B1. Therefore, optical cross-talk between the cells can be efficiently suppressed without any loss of photon detection efficiency.

Above the buried layer 22 the plurality of identical cells 1 is located, wherein each cell 1 is formed by the first layer 2 and the second layer 3. The first layer 2 is common for all cells 1 and it is contiguous throughout the photoelectric multiplier 20. The second layer 3 is formed as a thin layer of second conductivity type having a relatively high doping agent concentration like, for example, $10^{18}$ to $10^{19}$ cm$^{-3}$, and disposed on top of the first layer 2. The second layer 3 functions as an entrance window of the photoelectric multiplier 20. The first layer 2 and the second layer 3 form a first N-P junction at an interface between them, wherein in operation a reverse bias voltage is applied to the first N-P junction to such an extent that the photodiode operates in the Geiger mode. The thin strip-like silicon quenching resistor layers 5 of second conductance type connect each cell 1 with one of the voltage distribution lines 6 and serve as quenching resistors having a resistance of 10-50 KOhm/square. The voltage distribution lines 6 are made of second conductivity type silicon layers having a relatively high doping agent concentration like, for example, about $10^{19}$ cm$^{-3}$ or $5 \times 10^{18}$ cm$^{-3}$ to $5 \times 10^{19}$ cm$^{-3}$ of a doping agent concentration. The upper surface of the photoelectric multiplier 20 is covered by an insulation layer 7, in particular a silicon oxide layer, with corresponding antireflection properties at an upper surface thereof. Said strip-like quenching resistor layers 5 and voltage distribution lines 6 are disposed between the first layer 2 and the insulation layer 7. The voltage distribution lines 6 are connected together on the periphery of the photoelectric multiplier and there is merely a single input power supply contact through a single opening window in the insulation layer 7. Finally a grid-like aluminum layer 8 which is serving for the output of the SiPM signal is disposed on top of the silicon oxide layer 7.

The photoelectric multiplier 20 according to FIG. 3 is an embodiment of a highly efficient CMOS-technology compatible photoelectric multiplier. The buried layer 22 can be formed by the above described high energy ion implantation act which can be carried out at an appropriate time in the course of the CMOS fabrication process. Also the other layers like the second layer 3, the quenching resistor layers 5 and the voltage distribution lines 6 can be processed by further ion implantation acts at appropriate times in the course of the CMOS fabrication process.

The silicon based photoelectric multiplier 20 thus contains the substrate 21 of the second conductivity type, the buried layer 22 of the first conductivity type, a first layer 2 of first conductivity type, a second layer 3 of second conductivity type (entrance window), strip-like quenching resistor layers 5 (quenching resistors) of first conductivity type, voltage distribution buses 6, the insulation layer 7, and the grid-like layer 8 on top of the insulation layer 7. As an example, the substrate 21 can have p-type (n-type) conductivity, the buried first layer 22 can have n-type (p-type) conductivity, the layer 2 can have n-type (p-type) conductivity, the layers 3 can have p-type (n-type) conductivity, and the quenching resistor layers 5 and the voltage distribution lines 6 can have p-type (n-type) conductivity.

It should be noted further that according to the embodiment of FIG. 3 the buried layer 22 is fabricated as a non-planar layer; in particular, it is fabricated such that it comprises varying depth throughout the device. In FIG. 3 it can be seen that in areas between the cells 1 the buried first layer 22 is located deeper within the substrate as compared to the areas of the cells 1. The reason for this is that the electric field will be higher within the cells 1 as compared to the areas between the cells 1 so that merely light which is incident on the cell 1 will be efficiently detected merely by cell 1.

The highly efficient light detection in a broad part of the spectrum along with high uniformity of an electrical field is reached in a structure as that shown in FIG. 3, which is made by a CMOS-technology process. A high electric field needed for Geiger-type discharge (voltage above the breakdown value) is created in the N-P junction between the second layer 3 (entrance window) and the first layer 2.

In addition in the embodiment of FIG. 3, another N-P junction is made between the substrate 21 and the buried first layer 22, said junction preventing penetration of photoelectrons, created by secondary photons of the Geiger discharge, into the volume of adjacent cells. The penetration of the secondary Geiger photons into the adjacent cells is also prevented by high infrared absorption of the silicon mainly around the first p-n junction between the layers 2 and 3 due to the heavy ion implantation utilized to generate the buried first layer 22.

Highly Efficient CMOS-technology compatible photoelectric multipliers according to one of the above embodiments comprise independent cells typically having 20-100 microns of size, that is, for example, a length of one side edge of one cell 1 or second layer 3. All the cells are jointed through quenching resistors 5 with voltage distribution buses 6, and the identical bias voltage, exceeding the breakdown voltage, is applied to the cells 1, that provides working in the Geiger mode. The quenched Geiger discharge develops in the active region of the cell when a photon gets there. The quenching, that is stopping the discharge, takes place due to fluctuations of the number of the charge carriers up to zero when the voltage of the p-n boundary drops, due to availability of quenching resistor 5 (e.g., a current-limiting resistor) in each cell. The current signals from the fired cells are summed up on a common load. The amplification of each cell constitutes up to 107. The spread of amplification value is defined by technological spread of the cell capacity and breakdown voltage of the cell, and constitutes less than 5%. As all the cells are identical, the response of the detector to low intensity light flashes is proportional to the number of the worked cells, i.e. to light intensity.

FIGS. 4A-E show cross-sectional representations of intermediate products for illustrating a method for fabricating a cell for a silicon-based photoelectric multiplier according to an embodiment.

FIG. 4A shows a silicon substrate 21 of a second conductivity type having a doping agent concentration in the range of $5 \times 10^{14}$-$5 \times 10^{16}$ cm$^{-3}$.

FIG. 4B shows a cross-sectional representation of an intermediate product obtained after performing the ion implantation for generating the buried layer 22. The buried first layer 22 is generated by an ion implantation with an energy of the ions in the range between 1 MeV and 10 MeV, more preferably in the range between 3 MeV and 5 MeV, and an ion dose in the range between $10^{13}$ cm$^{-2}$ and $10^{15}$ cm$^{-2}$. The buried layer 22 further comprises a first conductivity type having a peak doping agent concentration in the range of, for example, $5 \times 10^{17}$-$5 \times 10^{18}$ cm$^{-3}$. By introducing the buried layer 22 a second p-n junction is generated (e.g., the first p-n junction will be generated later), the second p-n junction serving to pretend carrier cross-talk between the cells. The layer above the buried layer 22 will now be designated as first layer 2. The ion implantation also generates a relatively high density of defects distributed in the first layer 2 from the upper surface to the buried layer 22 wherein a relatively high density of defects is obtained in a region where the first p-n junction will have to be generated later. The defects generated by the ion implantation form energy states in the band gap of silicon, leading to an increasing sub gap absorption in the infrared spectral region.

FIG. 4C shows a cross-sectional representation of an intermediate product obtained after generating second layers 3 wherein each second layer 3 represents one cell or pixel of the photoelectric multiplier. The first layer 2 extends throughout the photoelectric multiplier and forms respective first p-n junctions with each one of the second layers 3. The second layers 3 can also be generated by a low energy ion implantation or, alternatively, also by diffusion doping. The second layers 3 can have a relatively high level dopant concentration of second conductivity in the range of $10^{18}$ to $10^{19}$ cm$^{-3}$.

Figure 4D:
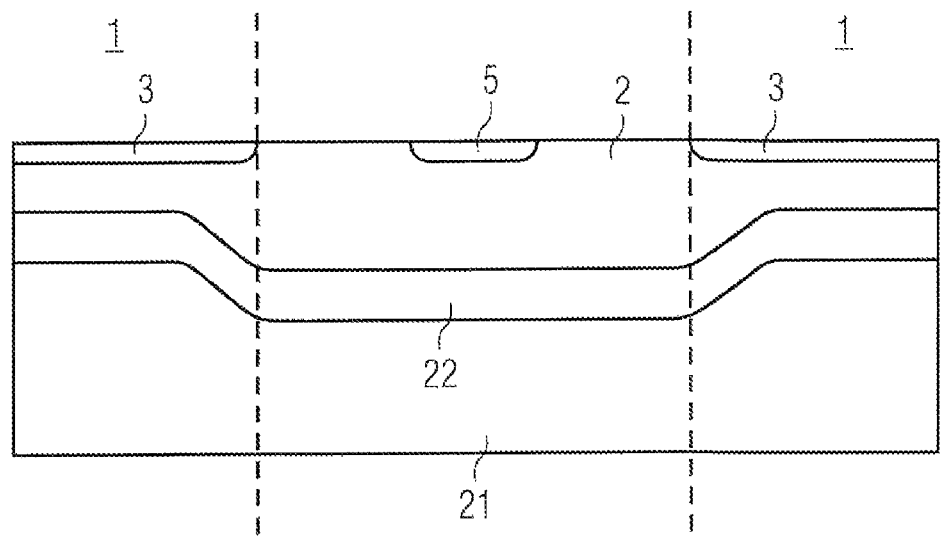
FIG. 4D illustrates a cross-sectional representation of intermediate products along line A-A of FIG. 2 of the silicon-based photoelectric multiplier for illustrating a method for fabricating cells for a silicon-based photoelectric multiplier according to an embodiment.

FIG. 4D shows a cross-sectional representation of an intermediate product obtained after fabricating the resistor layers 5. The resistor layers 5 serve as quenching resistors and comprise a resistance of 10-50 KOhm/square and can also be generated by an ion implantation act implanting ions of second conductivity type. After fabricating the resistor layers 5, voltage distribution lines 6 of second conductivity type can be fabricated by a further ion implantation act and having a relatively high doping agent concentration of $10^{19}$ cm$^{-3}$ or $5 \times 10^{18}$ cm$^{-3}$ to $5 \times 10^{19}$ cm$^{-3}$.

Figure 4E:
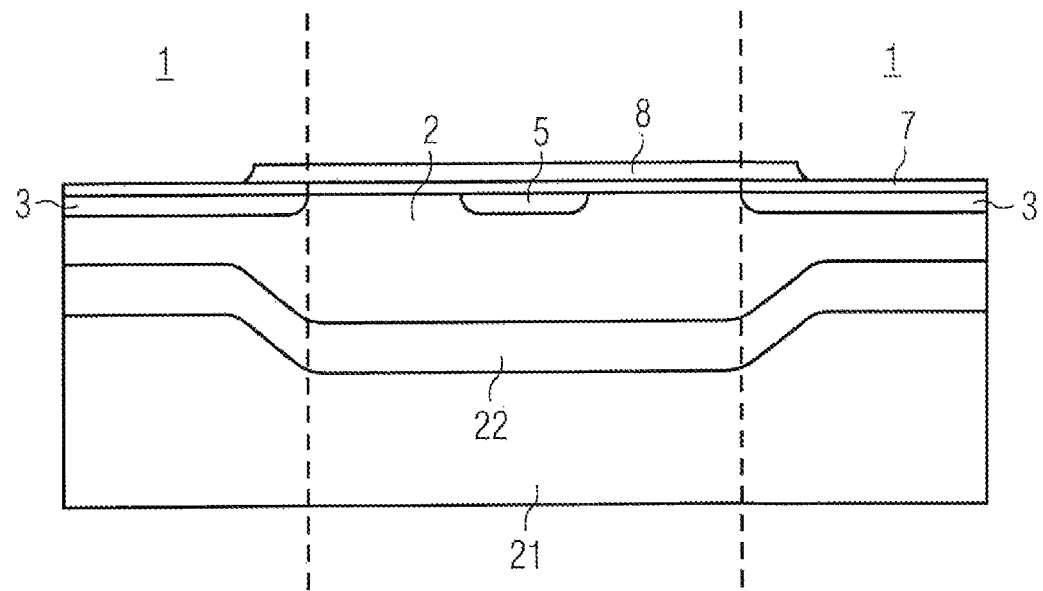
FIG. 4E illustrates a cross-sectional representation of intermediate products along line A-A of FIG. 2 of the silicon-based photoelectric multiplier for illustrating a method for fabricating cells for a silicon-based photoelectric multiplier according to an embodiment.

FIG. 4E shows a cross-sectional representation of an intermediate product obtained after depositing a silicon oxide layer 7 with antireflection properties on the whole surface of the photoelectric multiplier. Thereafter a grid-like layer 8, which can be fabricated of aluminum, is deposited onto the silicon oxide layer 7.

FIG. 5 shows a side view representation of a silicon-based photoelectric multiplier according to a second embodiment. The silicon-based photoelectric multiplier 30 is not fabricated by a CMOS fabrication process. Instead the fabrication process starts from a light or medium n-doped silicon substrate 31 on the upper surface of which a heavily doped p++ second layer 32 is generated by, for example, diffusion doping. Thereafter, a light or medium doped p-second layer 33 epitaxially grown onto the second layer 32. After epitaxially depositing the second layer 33 the ion implantation is carried out by selecting an ion energy in the range of 1 MeV to 10 MeV, more preferably in a range of 3 MeV to 5 MeV, and an ion dose in the range of $10^{13}$ cm$^{-2}$ to $10^{15}$ cm$^{-2}$. As the deep p++ doped second layer 32 already exists, in principle the ion implantation does not have to have doping properties but simply damaging properties so that in principle an implantation with helium, ions or even with protons could (e.g., also and/or alternatively) be carried out. However, the use of heavy ions like phosphorus, arsenic or boron turns out to be more efficient with respect to the damage level and the density of defects. Within the epitaxially grown second layer 33 a first p– doped second layer 34 and a second n+ second layer 35 are embedded so that they form a first n-p junction in the vicinity of the surface of the cell. Thereafter, on top of the second layer an insulation second layer 36 is deposited which can be fabricated of a silicon oxide layer. A through-hole is formed in the insulating second layer 36 at one end of it so that later the second layer 35 can be electrically contacted. Thereafter, a resistor second layer 37 is deposited on the insulating second layer 36 wherein the resistor second layer 37 can be fabricated of undoped or light doped polysilicon. The resistor second layer 37 acts as a quenching resistor to quench the Geiger discharge. Thereafter, the resistor second layer 37 of the cells are connected together and with a voltage distribution line 38.

FIG. 6 shows a cross-sectional representation of a radiation detector according to an embodiment. The radiation detector 40 includes a scintillator 41 that produces a scintillation or burst of light when a gamma-ray strikes the scintillator 41. The burst of light is received by an array of silicon-based photoelectric multipliers 42 as described above monolithically disposed a silicon substrate 43. The material of the scintillator 41 can be one of LSO, LYSO, MLS, LGSO, LaBr and mixtures thereof. Also other scintillator materials can be used. The scintillator 41 can be composed of a single crystal or an array of crystals. In addition an optional planar light pipe 44 can be interposed between the scintillator 41 and the multipliers 42 to improve the transmission of photons of the light bursts to the multipliers 42.

A plurality of radiation detectors 40 as shown in FIG. 6 can be arranged within a positron emission tomography (PET) imaging system.

What is claimed is:

1. A cell for a silicon based photoelectric multiplier, comprising:
    a first layer of a first conductivity type; and
    a second layer of a second conductivity type formed on the first layer, the first layer and the second layer forming a first p-n junction,
        the cell processed by an ion implantation step associated with one or more parameters that are selected such that, due to an implantation-induced damage of crystal lattice in a vicinity of the first p-n junction, an absorption length of infrared light of a wavelength in a range of ~800 nm to 1000 nm is decreased by at least a factor of 5.

2. The cell of claim 1, the ion implantation step comprising an ion dose in a range of $10^{13}$ to $10^{15}$ cm$^{-2}$ and an ion energy in a range of 1 MeV to 10 MeV.

3. The cell of claim 1, the ion implantation step followed by an annealing step.

4. The cell of claim 3, the annealing step carried out at a temperature in a range of 300° C. to 1000° C. for a time duration of at least 10 s.

5. The cell of claim 1, comprising:
a substrate; and
a doped buried layer, the substrate and the doped buried layer forming a second p-n junction.

6. The cell of claim 1, comprising:
a substrate of the second conductivity type; and
a doped buried layer of the first conductivity type, the substrate and the doped buried layer forming a second p-n junction.

7. The cell of claim 6, the ion implantation step followed by an annealing step.

8. The cell of claim 7, the annealing step carried out at a temperature in a range of 300° C. to 1000° C. for a time duration of at least 10 s.

9. The cell of claim 6, the ion implantation step comprising an ion dose in a range of $10^{13}$ to $10^{15}$ cm$^{-2}$ and an ion energy in a range of 1 MeV to 10 MeV.

10. A silicon-based photoelectric multiplier comprising a plurality of cells comprising the cell of claim 6, the plurality of cells fabricated on one common substrate.

11. A radiation detector comprising:
a scintillator; and
an array of silicon-based photoelectric multipliers comprising the silicon-based photoelectric multiplier of claim 10, the array arranged to receive bursts of light produced by the scintillator in response to received radiation.

12. A method for fabricating a cell for a silicon-based photoelectric multiplier comprising:
providing a first layer of a first conductivity type and a second layer of a second conductivity type formed on the first layer, the first layer and the second layer forming a first p-n junction; and
performing an ion implantation into the first layer and the second layer and selecting one or more parameters of the ion implantation such that, due to an implantation-induced damage of crystal lattice in a vicinity of the first p-n junction, an absorption length of infrared light of a wavelength in a range of ~800 nm to 1000 nm is decreased by at least a factor of 5.

13. The method of claim 12, comprising:
selecting at least some of the one or more parameters of the ion implantation such that an ion dose is in a range of $10^{13}$ to $10^{15}$ cm$^{-2}$ and an ion energy is in a range of 1 MeV to 10 MeV.

14. The method of claim 12, comprising annealing the cell after the ion implantation.

15. The method of claim 14, the annealing carried out at a temperature in a range of 300° C. to 1000° C. for a time duration of at least 10 s.

16. The method of claim 12, comprising:
using, for the ion implantation, one or more ions that are known to act as donor or acceptor ions in silicon.

17. The method of claim 12, comprising:
providing a substrate of the second conductivity type and generating a doped buried layer of the first conductivity type, the substrate and the doped buried layer forming a second p-n junction.

18. The method of claim 12, the cell and a second cell fabricated on a common substrate.

19. A silicon-based photoelectric multiplier comprising a plurality of cells comprising the cell of claim 1, the plurality of cells fabricated on one common substrate.

* * * * *